(12) United States Patent
Reddy

(10) Patent No.: US 9,899,546 B2
(45) Date of Patent: Feb. 20, 2018

(54) PHOTOVOLTAIC CELLS WITH ELECTRODES ADAPTED TO HOUSE CONDUCTIVE PASTE

(71) Applicant: SolarCity Corporation, San Mateo, CA (US)

(72) Inventor: Anand J. Reddy, Castro Valley, CA (US)

(73) Assignee: Tesla, Inc., Palo Alto, CA (US)

( * ) Notice: Subject to any disclaimer, the term of this patent is extended or adjusted under 35 U.S.C. 154(b) by 327 days.

(21) Appl. No.: 14/857,653

(22) Filed: Sep. 17, 2015

(65) Prior Publication Data

US 2016/0163888 A1 Jun. 9, 2016

Related U.S. Application Data

(60) Provisional application No. 62/088,509, filed on Dec. 5, 2014, provisional application No. 62/143,694, filed on Apr. 6, 2015.

(51) Int. Cl.

| | |
|---|---|
| *H01L 31/18* | (2006.01) |
| *H01L 31/0224* | (2006.01) |
| *H01L 31/05* | (2014.01) |
| *H01L 31/0443* | (2014.01) |
| *H01L 31/049* | (2014.01) |

(Continued)

(52) U.S. Cl.
CPC ...... *H01L 31/022433* (2013.01); *B23P 19/04* (2013.01); *H01L 31/049* (2014.12); *H01L 31/0443* (2014.12); *H01L 31/0504* (2013.01); *H01L 31/0516* (2013.01); *H01L 31/188* (2013.01); *H01L 31/1876* (2013.01);

(Continued)

(58) Field of Classification Search
CPC . H01L 31/02; H01L 31/0201; H01L 31/0224; H01L 31/022425; H01L 31/022433; H01L 31/05; H01L 31/18
See application file for complete search history.

(56) References Cited

U.S. PATENT DOCUMENTS

| | | |
|---|---|---|
| 819,360 A | 3/1902 | Mayer |
| 2,626,907 A | 1/1953 | De Groote |

(Continued)

FOREIGN PATENT DOCUMENTS

| | | |
|---|---|---|
| CN | 1253381 | 5/2000 |
| CN | 1416179 | 10/2001 |

(Continued)

OTHER PUBLICATIONS

Hornbachner et al., "Cambered Photovoltaic Module and Method for its Manufacture" Jun. 17, 2009.

(Continued)

*Primary Examiner* — Susan D Leong
(74) *Attorney, Agent, or Firm* — Shun Yao; Park, Vaughan, Fleming & Dowler, LLP

(57) ABSTRACT

One embodiment of the present invention provides an electrode grid positioned at least on a first surface of a photovoltaic structure. The electrode grid can include a number of finger lines and an edge busbar positioned at an edge of the photovoltaic structure. The edge busbar can include one or more paste-alignment structures configured to facilitate confinement of conductive paste used for bonding the edge busbar to an opposite edge busbar of an adjacent photovoltaic structure.

23 Claims, 13 Drawing Sheets

(51) Int. Cl.
*H02S 20/25* (2014.01)
*H02S 50/10* (2014.01)
*B23P 19/04* (2006.01)

(52) U.S. Cl.
CPC .............. *H02S 20/25* (2014.12); *H02S 50/10* (2014.12); *Y02B 10/12* (2013.01); *Y02E 10/50* (2013.01)

(56) References Cited

U.S. PATENT DOCUMENTS

| | | |
|---|---|---|
| 2,938,938 A | 5/1960 | Dickson |
| 3,094,439 A | 6/1963 | Mann |
| 3,116,171 A | 12/1963 | Nielson |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,729,970 A | 3/1988 | Nath |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |

(56) References Cited

U.S. PATENT DOCUMENTS

| | | |
|---|---|---|
| 2004/0103937 A1 | 6/2004 | Bilyalov |
| 2004/0112419 A1 | 6/2004 | Boulanger |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022861 A1 | 2/2005 | Rose |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami |
| 2005/0126622 A1 | 6/2005 | Mukai |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0011350 A1 | 1/2008 | Luch |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0149161 A1 | 6/2008 | Nishida |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0014055 A1 | 1/2009 | Beck |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0120492 A1 | 5/2009 | Sinha |
| 2009/0139512 A1 | 6/2009 | Lima |
| 2009/0151783 A1 | 6/2009 | Lu |
| 2009/0155028 A1 | 6/2009 | Boguslayskiy |
| 2009/0160259 A1 | 6/2009 | Ravindranath |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0272419 A1 | 11/2009 | Sakamoto |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0300525 A1* | 12/2010 | Lim .................. H01L 31/02242 136/256 |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0030777 A1* | 2/2011 | Lim .................. H01L 31/02242 136/256 |
| 2011/0073175 A1 | 3/2011 | Hilali |
| 2011/0088762 A1 | 4/2011 | Singh |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |

(56) References Cited

U.S. PATENT DOCUMENTS

| | | |
|---|---|---|
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1 | 8/2014 | Albadri |
| 2014/0261624 A1 | 9/2014 | Cruz-Campa |
| 2014/0318611 A1 | 10/2014 | Moslehi |
| 2014/0345674 A1 | 11/2014 | Yang |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1 | 6/2016 | Agrawal |
| 2016/0204289 A1 | 7/2016 | Tao |
| 2016/0329443 A1 | 11/2016 | Wang |
| 2017/0084766 A1* | 3/2017 | Yang ................ H01L 31/0508 |

FOREIGN PATENT DOCUMENTS

| | | |
|---|---|---|
| CN | 101233620 | 7/2008 |
| CN | 101553933 | 10/2009 |
| CN | 100580957 C | 1/2010 |
| CN | 101305454 | 5/2010 |
| CN | 102088040 | 6/2011 |
| CN | 102263157 | 11/2011 |
| CN | 104409402 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | 102012010151 | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | 5789269 | 6/1982 |
| JP | H04245683 A | 9/1992 |
| JP | 06196766 | 7/1994 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| TM | 2010104726 A2 | 9/2010 |

(56) References Cited

FOREIGN PATENT DOCUMENTS

| WO | 1991017839 | | 11/1991 |
|----|------------|----|---------|
| WO | 9120097 | A1 | 12/1991 |
| WO | 2003083953 | A1 | 10/2003 |
| WO | 2006097189 | A1 | 9/2006 |
| WO | 2008089657 | | 7/2008 |
| WO | 2009094578 | | 7/2009 |
| WO | 2009150654 | | 12/2009 |
| WO | 2009150654 | A2 | 12/2009 |
| WO | 2010070015 | | 6/2010 |
| WO | 2010075606 | | 7/2010 |
| WO | 2010075606 | A1 | 7/2010 |
| WO | 2010123974 | | 10/2010 |
| WO | 2010123974 | A1 | 10/2010 |
| WO | 2011005447 | | 1/2011 |
| WO | 2011005447 | A2 | 1/2011 |
| WO | 2011008881 | | 1/2011 |
| WO | 2011008881 | A2 | 1/2011 |
| WO | 2011053006 | | 5/2011 |
| WO | 2011123646 | A2 | 10/2011 |
| WO | 2013020590 | | 2/2013 |
| WO | 2013020590 | A1 | 2/2013 |
| WO | 2010085949 | | 3/2013 |
| WO | 2013046351 | | 4/2013 |
| WO | 2014066265 | | 5/2014 |
| WO | 2014074826 | | 7/2014 |
| WO | 2014110520 | | 7/2014 |
| WO | 2014117138 | | 7/2014 |
| WO | 2015183827 | | 12/2015 |
| WO | 2016090332 | | 6/2016 |

OTHER PUBLICATIONS

Kanani, Nasser. Electroplating: Basic Principles, Processes and Practice, Chapter 8—"Coating Thickness and its Measurement," 2004, pp. 247-291.

P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.

L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.

Machine translation of JP 10004204 A, Shindou et al.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Jianhua Zhao et al. "24% Efficient perl silicon solar cell: Recent improvements in high efficiency silicon cell research".

"Nonequilibrium boron doping effects in low-temperature epitaxial silicon" Meyerson et al., Appl. Phys. Lett. 50 (2), p. 113 (1987).

"Doping Diffusion and Implantation" Parthavi, <http://www.leb.eei.uni-erlangen.de/winterakademie/2010/report/content/course03/pdf/0306.pdf>.

Meyerson et al. "Nonequilibrium boron doping effects in low-temperature epitaxial silicon", Appl. Phys. Lett. 50 (2), p. 113 (1987).

Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.

WP Leroy et al., "In Search for the Limits of Rotating Cylindrical Magnetron Sputtering", Magnetron, ION Processing and ARC Technologies European Conference, Jun. 18, 2010, pp. 1-32.

Beaucarne G et al: 'Epitaxial thin-film Si solar cells' Thin Solid Films, Elsevier-Sequoia S.A. Lausanne, CH LNKD-DOI:10.1016/J.TSF.2005.12.003, vol. 511-512, Jul. 26, 2006 (Jul. 26, 2006), pp. 533-542, XP025007243 ISSN, 0040-6090 [retrieved on Jul. 26, 2006].

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heterojunction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Roedern, B. von, et al., 'Why is the Open-Circuit Voltage of Crystalline Si Solar Cells so Critically Dependent on Emitter- and Base-Doping?' Presented at the 9th Workshop on Crystalline Silicon Solar Cell Materials and Processes, Breckenridge, CO, Aug. 9-11, 1999.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.

Yao Wen-Jie et al: 'Interdisciplinary Physics and Related Areas of Science and Technology; The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.

* cited by examiner

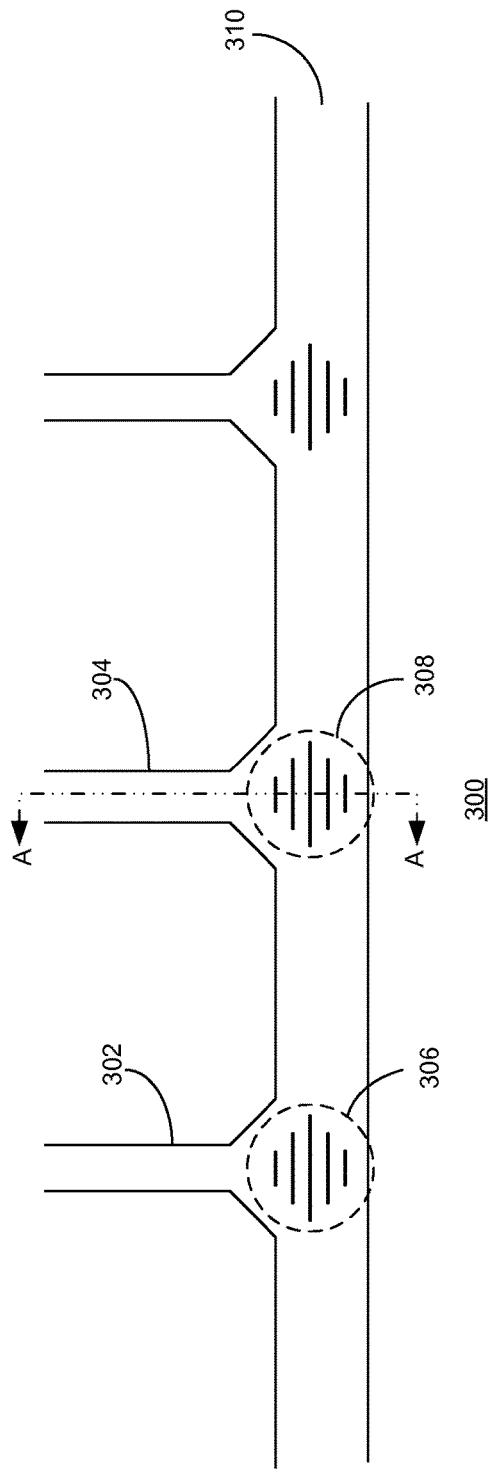
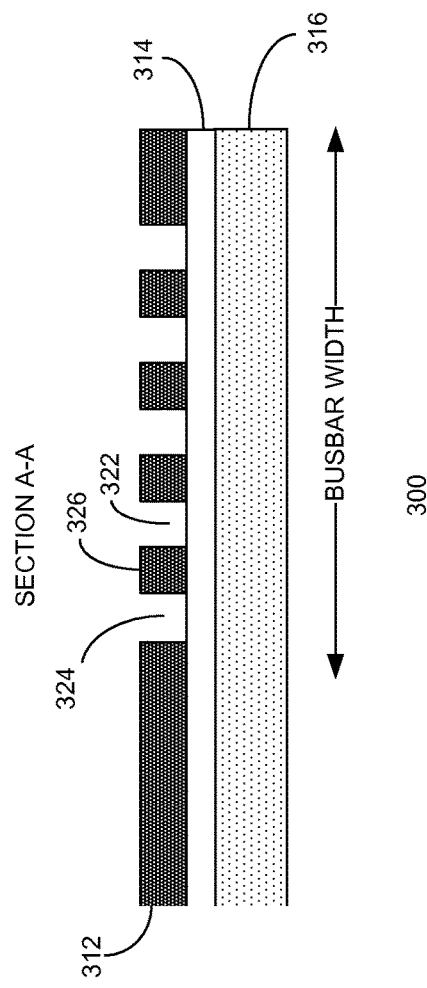
FIG. 3A
FIG. 3B

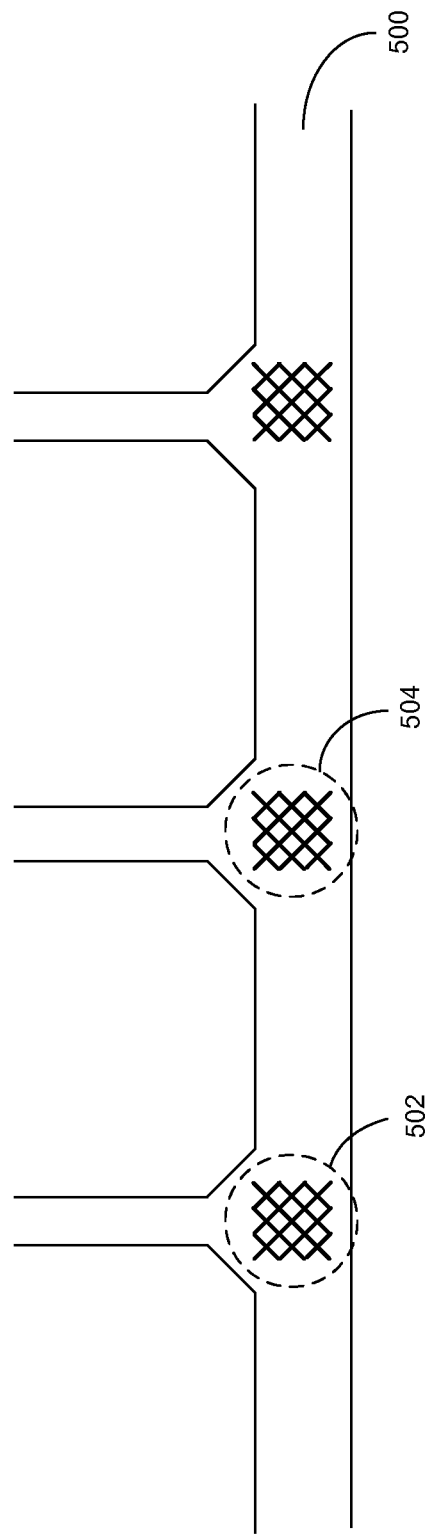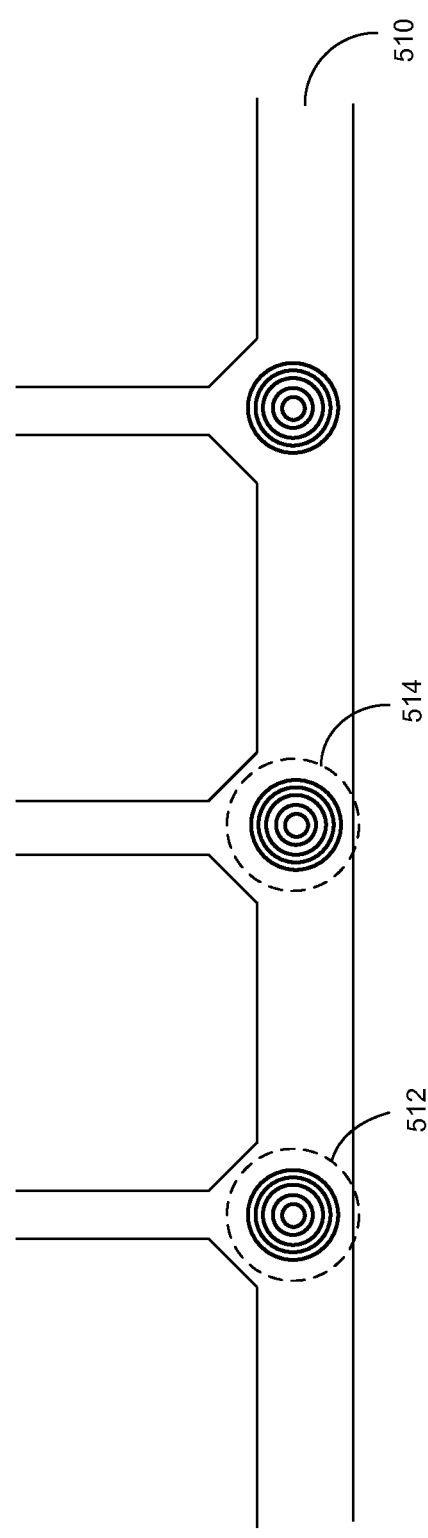

PHOTOVOLTAIC CELLS WITH ELECTRODES ADAPTED TO HOUSE CONDUCTIVE PASTE

CROSS-REFERENCE TO OTHER APPLICATIONS

This claims the benefit of U.S. Provisional Application No. 62/088,509, entitled "SYSTEM, METHOD, AND APPARATUS FOR AUTOMATIC MANUFACTURING OF SOLAR PANELS," filed Dec. 5, 2014; and U.S. Provisional Application No. 62/143,694, entitled "SYSTEMS AND METHODS FOR PRECISION AUTOMATION OF MANUFACTURING SOLAR PANELS," filed Apr. 6, 2015; the disclosures of which are incorporated herein by reference in their entirety for all purposes.

This is also related to U.S. patent application Ser. No. 14/563,867, entitled "HIGH EFFICIENCY SOLAR PANEL," filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014; the disclosures of which are incorporated herein by reference in their entirety for all purposes.

FIELD OF THE INVENTION

This generally relates to the electrode design for photovoltaic structures. More specifically, this disclosure is related to photovoltaic structures having specially designed electrodes for housing conductive paste.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which is used to make solar panels, have helped solar energy gain mass appeal among those wishing to reduce their carbon footprint and decrease their monthly energy costs. However, the panels are typically fabricated manually, which is a time-consuming and error-prone process. This makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014 and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

Fabrications of such cascaded panels can involve overlapping edges of adjacent cells in such a way that the electrodes (busbars) on opposite sides of the overlapped cells are in contact to establish an electrical connection. This process is repeated for a number of successive cells until one string of cascaded cells is created. A number of strings are then coupled to each other (either in series or in parallel) and placed in a protective frame. To further reduce internal resistance of the entire panel and to ensure that the manufactured panel is compatible with conventional panels, one form of the cascaded panel (as described in the aforementioned patent application) can include a series of solar cell strips created by dividing complete solar cells into smaller pieces (i.e., the strips). These smaller strips can then be cascaded to form a string. Arranging strips in a cascaded manner requires proper alignment of the strips. Moreover, to ensure proper electrical coupling, conductive paste can be deposited onto the busbars of the strips before the strips are edge-overlapped.

SUMMARY

One embodiment of the present invention provides an electrode grid positioned at least on a first surface of a photovoltaic structure. The electrode grid can include a number of finger lines and an edge busbar positioned at an edge of the photovoltaic structure. The edge busbar can include one or more paste-alignment structures configured to facilitate confinement of conductive paste used for bonding the edge busbar to an opposite edge busbar of an adjacent photovoltaic structure.

In a variation on this embodiment, the paste-alignment structures can include one or more alignment pads.

In a further variation, a respective alignment pad can be located at an intersection between a finger line and the edge busbar.

In a further variation, a respective alignment pad can include a plurality of trenches.

In a further variation, the trenches include areas that are absent of conductive material that forms the edge busbar, and the trenches can be formed in a same fabrication process that forms the edge busbar.

In a further variation, forming the trenches may involve exposing dry film resist via a patterned mask which defines the edge busbar and locations and sizes of the trenches.

In a further variation, the trenches can be formed by partially etching the edge busbar at predetermined locations.

In a further variation, the trenches can be aligned in a direction parallel to the edge busbar.

In a further variation, a respective trench can have a width between 30 and 200 microns.

In a variation on this embodiment, the paste-alignment structures can include a channel running a length of the edge busbar.

In a variation on this embodiment, the edge busbar can include a Cu layer formed using an electroplating process.

BRIEF DESCRIPTION OF THE FIGURES

FIG. 3A shows a partial top view of a strip, according to an embodiment of the present invention.

FIG. 3B shows a partial cross-sectional view of the strip, according to an embodiment of the present invention.

FIG. 5A shows a partial top view of a strip, according to an embodiment of the present invention.

FIG. 5B shows a partial top view a strip, according to an embodiment of the present invention.

In the figures, like reference numerals refer to the same figure elements.

DETAILED DESCRIPTION

Figure 1A:
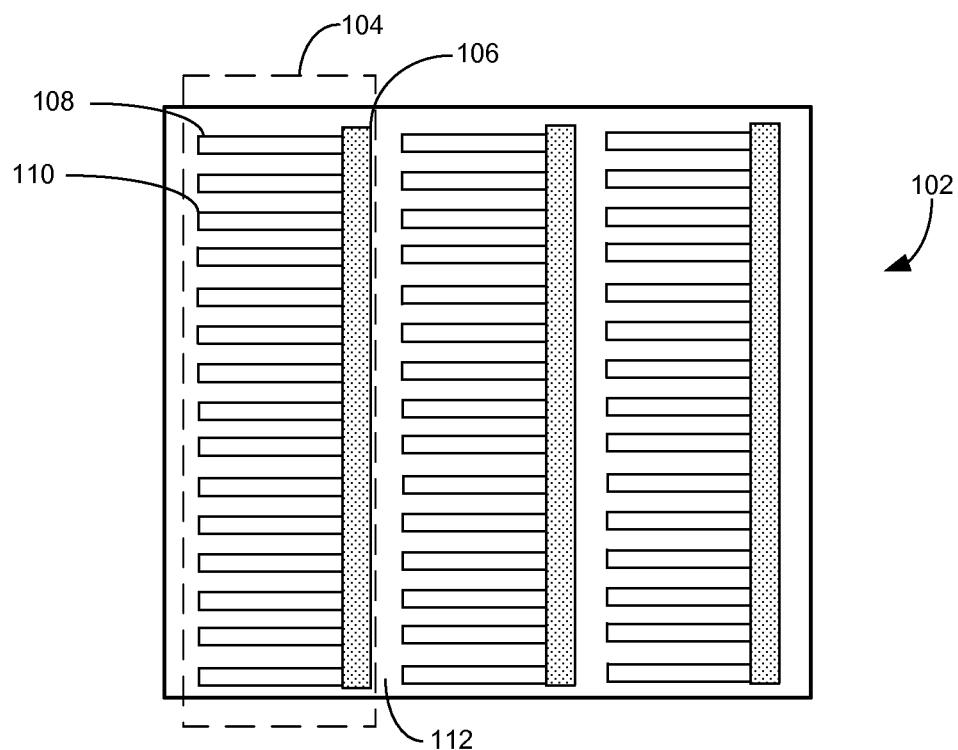
FIG. 1A shows an exemplary grid pattern on the front surface of a photovoltaic structure, according to one embodiment of the present invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can provide a photovoltaic structure that can include specially designed electrodes for housing conductive paste. More specifically, a busbar located on the top surface of a photovoltaic structure can include, at specified locations, trenches that can facilitate confinements of the conductive paste to prevent paste overflow. Alternatively, the busbar may include an internal channel running the length of the busbar for housing the conductive paste.

Solar Panel Based on Cascaded Strips

As described in U.S. patent application Ser. No. 14/563,867, a solar panel can have multiple (e.g., 3) strings, each string including cascaded strips, connected in parallel. Such a multiple-parallel-string panel configuration provides the same output voltage with a reduced internal resistance. In general, a cell can be divided into n strips, and a panel can contain n strings. Each string can have the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string. Therefore, in general, a greater n can lead to a lower total internal resistance, and hence more power extracted from the panel. However, a tradeoff is that as n increases, the number of connections required to inter-connect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance is, the greater n might need to be to effectively reduce the panel's overall internal resistance. Therefore, the type of electrode can dictate the number of strips. For example, conventional silver-paste or aluminum-based electrode typically cannot produce ideal resistance between the electrode and underlying photovoltaic structure. As a result, such electrodes may require n to be greater than 4. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n can be selected to be three, which is less than the n value generally needed for cells with silver-paste electrodes or other types of electrodes. Correspondingly, two grooves can be scribed on a single cell to allow the cell to be divided into three strips.

In addition to lower contact resistance, electro-plated copper electrodes can also offer better tolerance to micro cracks, which may occur during a cleaving process. Such micro cracks might adversely impact silver-paste-electrode cells. Plated-copper electrode, on the other hand, can preserve the conductivity across the cell surface even if there are micro cracks in the photovoltaic structure. The copper electrode's higher tolerance for micro cracks can allow one to use thinner silicon wafers to manufacture cells. As a result, the grooves to be scribed on a cell can be shallower than the grooves scribed on a thicker wafer, which in turn can help increase the throughput of the scribing process. More details on using copper plating to form low-resistance electrodes on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure, according to one embodiment of the present invention. In the example shown in FIG. 1A, grid 102 can include three sub-grids, such as sub-grid 104. This three sub-grid configuration can allow the photovoltaic structure to be divided into three strips. To enable cascading, each sub-grid can have an edge busbar, which can be located either at or near the edge. In the example shown in FIG. 1A, each sub-grid can include an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. To facilitate the subsequent laser-assisted scribe-and-cleave process, a predefined blank space (i.e., space not covered by electrodes) can be inserted between the adjacent sub-grids. For example, blank space 112 can be defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to a more tolerant scribing operation and a narrower space that leads to more effective current collection. In a further embodiment, the width of such a blank space can be approximately 1 mm.

Figure 1B:
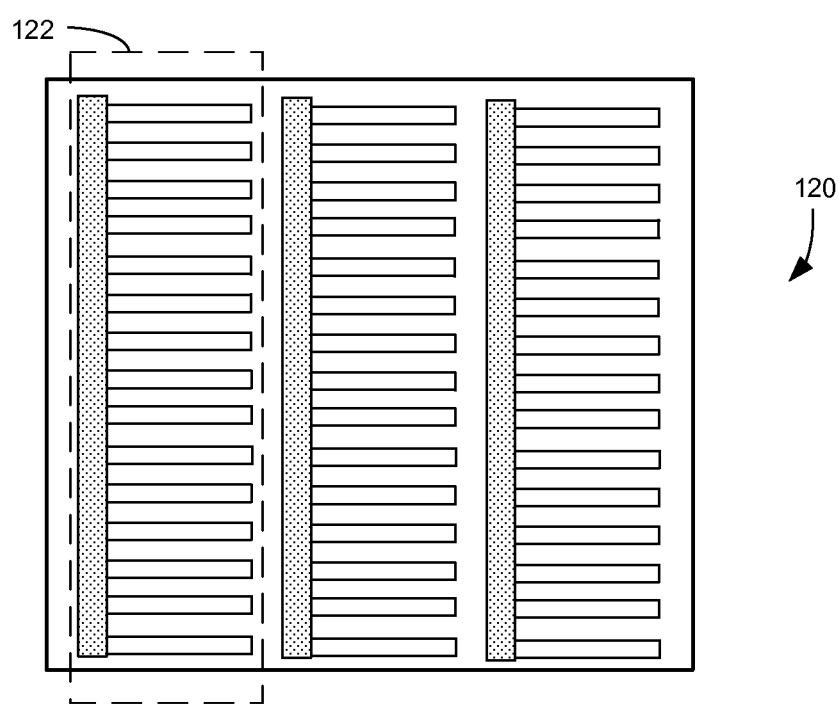
FIG. 1B shows an exemplary grid pattern on the back surface of a photovoltaic structure, according to one embodiment of the invention.

FIG. 1B shows an exemplary grid pattern on the back surface of a photovoltaic structure, according to one embodiment of the invention. In the example shown in FIG. 1B, back grid 120 can include three sub-grids, such as sub-grid 122. To enable cascaded and bifacial operation, the back sub-grid may correspond to the front sub-grid. More specifically, the back edge busbar can be located at the opposite edge of the frontside edge busbar. In the examples shown in FIGS. 1A and 1B, the front and back sub-grids can have similar patterns except that the front and back edge busbars are located adjacent to opposite edges of the strip. In addition, locations of the blank spaces in back conductive grid 120 can correspond to locations of the blank spaces in front conductive grid 102, such that the grid lines do not interfere with the subsequent scribe-and-cleave process. In practice, the finger line patterns on the front and back sides of the photovoltaic structure may be the same or different.

In the examples shown in FIGS. 1A and 1B, the finger line patterns can include continuous, non-broken loops. For example, as shown in FIG. 1A, finger lines 108 and 110 can both include connected loops. This type of "looped" finger line pattern can reduce the likelihood of the finger lines from peeling away from the photovoltaic structure after a long period of use. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
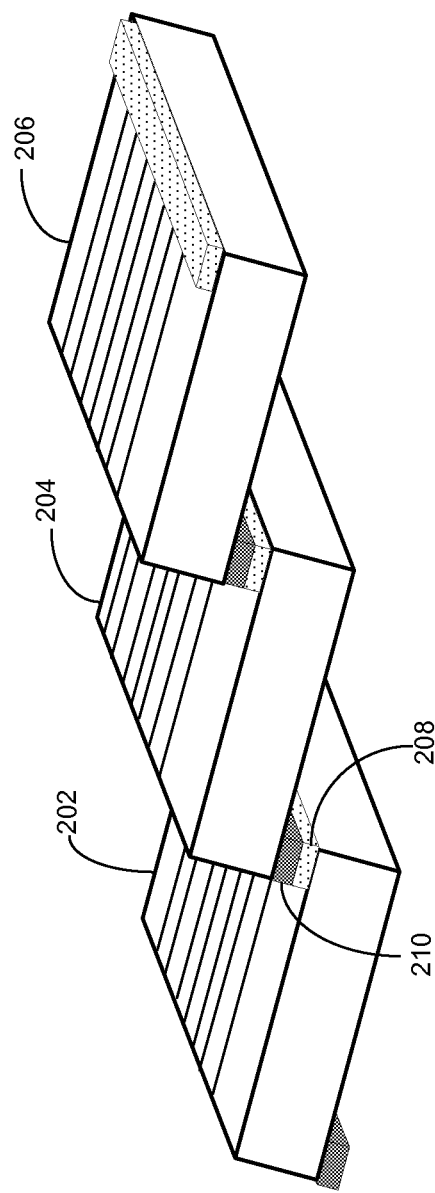
FIG. 2A shows a string of cascaded strips, according to an embodiment of the invention.

To form a cascaded string, cells or strips (e.g., as a result of a scribing-and-cleaving process applied to a regular square cell) can be cascaded with their edges overlapped. FIG. 2A shows a string of cascaded strips, according to an embodiment of the invention. In FIG. 2A, strips 202, 204, and 206 can be stacked in such a way that strip 206 can partially overlap adjacent strip 204, which can also partially overlap (on an opposite edge) strip 202. Such a string of strips can form a pattern that is similar to roof shingles. Each strip can include top and bottom edge busbars located at opposite edges of the top and bottom surfaces, respectively. Strips 202 and 204 may be coupled to each other via an edge busbar 208 located at the top surface of strip 202 and an edge busbar 210 located at the bottom surface of strip 204. To establish electrical coupling, strips 202 and 204 can be placed in such a way that bottom edge busbar 210 is placed on top of and in direct contact with top edge busbar 208.

Figure 2B:
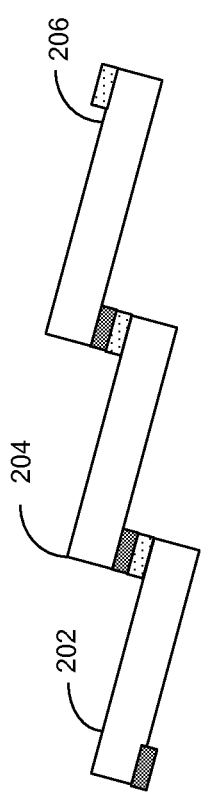
FIG. 2B shows a side view of the string of cascaded strips, according to one embodiment of the invention.

FIG. 2B shows a side view of the string of cascaded strips, according to one embodiment of the invention. In the example shown in FIGS. 2A and 2B, the strips can be part of a 6-inch square photovoltaic structure, with each strip having a dimension of approximately 2 inches by 6 inches. To reduce shading, the overlapping between adjacent strips should be kept as small as possible. In some embodiments, the single busbars (both at the top and the bottom surfaces) can be placed at the very edge of the strip (as shown in FIGS. 2A and 2B). The same cascaded pattern can extend along an entire row of strips to form a serially connected string.

Busbars with Alignment Pads

When forming a solar panel, adjacent strips may be bonded together via edge busbars. Such bonding can be important to ensure that the electrical connections are well maintained when the solar panel is put into service. One option for bonding the metallic busbars can include soldering. For example, the surface of the edge busbars may be coated with a thin layer of Sn. During a subsequent lamination process, heat and pressure can be applied to cure sealant material between photovoltaic structures and the covers. The same heat and pressure can also solder together the edge busbars that are in contact, such as edge busbars 208 and 210. However, the rigid bonding between the soldered contacts may lead to cracking of the thin strips. Moreover, when in service solar panels often experience many temperature cycles, and the thermal mismatch between the metal and the semiconductor may create structural stress that can lead to fracturing.

To reduce the thermal or mechanical stress, it can be preferable to use a bonding mechanism that is sufficiently flexible and can withstand many temperature cycles. One way to do so is to bond the strips using flexible adhesive that is electrically conductive. For example, adhesive (or paste) can be applied on the surface of top edge busbar 208 of strip 202 (shown in FIG. 2A). When strip 204 is placed to partially overlap with strip 202, bottom edge busbar 210 can be bonded to top edge busbar 208 by the adhesive, which can be cured at an elevated temperature. Different types of conductive adhesive or paste can be used to bond the busbars. In one embodiment, the conductive paste can include a conductive metallic core surrounded by a resin. When the paste is applied to a busbar, the metallic core establishes an electrical connection with the busbar while the resin that surrounds the metallic core functions as an adhesive. In another embodiment, the conductive adhesive may be in the form of a resin that includes a number of suspended conductive particles, such as Ag or Cu particles. The conductive particles may be coated with a protective layer. When the paste is thermally cured, the protective layer can evaporate to enable electrical conductivity between the conductive particles suspended inside the resin.

When applying paste to the busbars, one needs to be concerned with the problem of paste overflow, especially for less viscous paste material. In some embodiments, the conductive paste can include metallic particles suspended in a resin, and the volume fraction of the metallic particles can be between 50 and 90%. The viscosity of such conductive paste can be around 20 Pa·s (Pascal. second), which is relatively small. For such paste, overflow can occur when a busbar having paste on its surface is stacked against another busbar or when the paste is thermally cured. When the conductive paste expands beyond the busbar, it may come into contact with the strip edge, leading to the shunting of the strip. Even if the overflowing paste does not reach the strip edge but flows toward the other side, it can still be problematic because such overflowing paste can cause additional shading to the strip surface.

One approach to prevent paste overflow is to apply a smaller amount of paste. For example, droplets of paste that are much smaller compared to the busbar dimension may have a smaller chance of overflowing. However, these smaller droplets may not be able to provide the reliable mechanical bonding and sufficient electrical conductivity that are required by high performance solar panels. During the manufacturing of high performance panels, a sufficient amount of paste, which can be in the form of droplets or strands, may be applied to each busbar, which can increase the possibility of paste overflow. On one hand, after the application of the paste, the strips may be transferred to other workstations for further processing, which can include cleaving or stacking up. While being transferred, the strips can be carried by a conveyor or picked up by a robotic arm. Such movements of the strips may cause the conductive paste to flow or shift locations. On the other hand, if the paste-dispensing machine is not perfectly aligned to the center of the busbar, the paste may be deposited off center onto the busbar. Larger droplets or wider strands can lead to a higher possibility of paste overflow in both cases.

In some embodiments of the present invention, the busbars can be designed to include paste-confinement features to facilitate the confinement of the conductive paste, thus reducing the possibility of paste overflow. There are various embodiments of the paste-confinement features. In some embodiments, the confinement of the paste can be achieved by increasing the area of contact, and hence the drag force, between the paste droplets or strands and the busbar. To do so, additional topography, such as trenches or valleys, can be formed on the busbar. FIG. 3A shows a partial top view of a strip, according to an embodiment of the present invention. In FIG. 3A, strip 300 can include busbar 310 and a plurality of finger lines, such as finger lines 302 and 304. Busbar 310 can be an edge busbar that intersects with the finger lines at a number of T-intersections. In addition to edge busbar 310 shown in FIG. 3A, solutions provided by embodiments of the present invention can also be applied to non-edge busbars. FIG. 3A shows that the fingers are tapered at each busbar-finger intersection. The purpose of such tapering is to prevent current crowding. In addition to the straight tapers shown in FIG. 3A, the fingers may also have tapers of other shapes, such as arcs or parabolas.

In the example shown in FIG. 3A, a number of trenches can be created at each busbar-finger intersection, forming regions called "alignment pads." Conductive paste can be expected to be deposited onto these alignment pads to facilitate bonding between two cascaded strips. For example, alignment pad 306 can be formed at the intersection between busbar 310 and finger 302, and alignment pad 308 can be formed at the intersection between busbar 310 and finger 304. Compared with conventional busbars with a smooth surface, the busbars with alignment pads can provide enhanced ability to confine the conductive paste at desired locations, thus lowering the possibility of paste overflow. Each alignment pad can include multiple trenches, which can have the same or different lengths. In FIG. 3A, the trenches can have various lengths with the center trench being the longest and the outermost trench being the shortest. Such an arrangement can create alignment pads with a profile similar to a circle to match the shape of a paste droplet.

In some embodiments, the length of the trenches can be between 30 and 200 microns. Typical finger lines can be between 30 and 50 microns wide, and typical busbars can be between 800 and 1500 microns wide. Accordingly, the length of the trenches can often be chosen to be larger than the finger width but smaller than the busbar width. In general, the size of the alignment pad can be comparable to the size of a paste droplet, whose diameter can be between 300 and 400 microns. In some embodiments, an alignment pad can be created at each busbar-finger intersection. In other embodiments, the alignment pads can be formed at other busbar locations, and have equal or variable spacing. The number of alignments pads on a busbar can be determined by the number of paste droplets that will be subsequently deposited onto the busbar. In some embodiments, a busbar may include between 50 and 80 alignment pads.

FIG. 3B shows a partial cross-sectional view of the strip, according to an embodiment of the present invention. More specifically, FIG. 3B shows the sectional view along cut plane A-A, indicated by dashed arrows shown in FIG. 3A. Plane A-A cuts through the middle of the busbar in a direction that is vertical to the length of the trenches.

Consequently, FIG. 3B illustrates the layer structure of the strip as well as the profile of the trenches. In the example shown in FIG. 3B, strip 300 can include an electrode grid 312, a transparent conductive oxide (TCO) layer 314, and a photovoltaic body 316. Photovoltaic body 316 often can include a Si base layer and an emitter layer. Photovoltaic body 316 can optionally include other layers for enhancing its efficiency, such as quantum-tunneling barrier (QTB) layers and surface field layers. The scope of the instant application is not limited by the specific structure of photovoltaic body 316.

Electrode grid 312 can include one or more layers of conductive material, which can include metallic material or non-metallic conductive material. In some embodiments, grid 312 can include an electroplated Cu layer. In further embodiments, grid 312 can additionally include one or more adhesive metallic layers for improving adhesion between the electroplated Cu layer and TCO layer 314. The adhesive layers can be deposited on the surface of TCO layer 314 using a physical vapor deposition (PVD) technique. Materials used to form the adhesive layers include, but are not limited to: Ti, titanium nitride ($TiN_x$), titanium tungsten ($TiW_x$), titanium silicide ($TiSi_x$), titanium silicon nitride (TiSiN), Ta, tantalum nitride ($TaN_x$), tantalum silicon nitride ($TaSiN_x$), nickel vanadium (NiV), tungsten nitride ($WN_x$), Co, W, Cr, Mo, Ni, and their combinations. In some embodiments, the thickness of grid 312 can be between 10 and 50 microns.

One can see from FIG. 3B that grid 312 can include, at the busbar location, multiple trenches, such as trenches 322 and 324. The trenches can be defined as areas that are absent of the conductive material that forms grid 312, such as metal. Adjacent trenches can be separated by a strip of grid material, i.e., a conductive strip. For example, trenches 322 and 324 can be separated by conductive strip 326. In the example shown in FIGS. 3A and 3B, the conductive strips located between trenches are connected to the rest of the busbar. In other words, the busbar can include a continuously extended layer of conductive material, e.g., metal, with trenches created at isolated locations. Maintaining the metal continuity while creating trenches can reduce the impact to the series resistance of the busbar by the created trenches.

Various methods can be used to create the trenches. In some embodiments, the trenches can be created concurrently with the formation of grid 312. More specifically, the formation of grid 312 often can involve a patterned mask, and the trenches can be a built-in feature of the patterned mask. Therefore, in some embodiments, once grid 312 is formed, it can be formed with trenches located at desired locations. For example, before forming the grid (which can include an electroplated Cu layer and multiple metallic adhesive layers), a patterned mask can be deposited on the TCO layer. The patterned mask can define the grid by creating windows at the desired locations. During the electroplating process, metal ions can only be deposited onto the exposed TCO defined by the windows, forming busbars and finger lines of the grid. The trenches can be similarly defined by adding masking material, which can include photoresist or $SiO_2$, at desired locations inside the window designed for the busbar. Consequently, when grid 312 is formed, the added masking material can prevent deposition of the metal, thus creating trenches inside the busbar. By incorporating patterns for forming the trenches in the same mask that defines the grid, this approach can form alignment pads without any additional fabrication procedures. In addition to PVD and electroplating, the grid can also be formed using a standard screen printing technique. In such a case, the trenches can be part of the screen printing pattern.

For the mask-based metal-deposition process, the resolution of the trenches can be limited by the resolution of the mask. In some embodiments, the patterned mask can be formed by exposing dry film resist to ultraviolet light, which can create sub-micron features. In some embodiments, the width of the trenches, such as trenches 322 and 324, can be between 30 and 200 microns. Similarly, the spacing between the trenches, which can equal the width of conductive strip 326, can also be between 30 and 200 microns. Depending on the thickness of grid 312, the width of conductive strip 326 may be carefully controlled to ensure that the aspect ratio of conductive strip 326 is not too large to avoid possible collapse of conductive strip 326. In some embodiments, the height-to-width ratio of conductive strip 326 is less than 2.

In addition to preventing the collapse of metal columns, small height-to-width ratio for the conductive strips can also reduce the series resistance of the grid. Collected current from the photovoltaic structure may flow through the busbar area. If the conductive strips situated between trenches are too thin, the series resistance of the busbar may be significantly increased. In general, there can be tradeoff between the busbar's series resistance and the ability of the busbar to capture the conductive paste. Wider trenches, and hence thinner conductive strips, can trap more paste, but may result in increased busbar resistance. This issue may be addressed by choosing a paste with a particular density of conductive particles to compensate for the loss of conductive material due to trenches. Stated differently, if the density of conductive particles is high enough, the paste filling the gaps (e.g., gap 324) may provide an electrical connectivity that is comparable to the one provided by the conductive strips (e.g., strip 326).

Another advantage provided by the trench configuration shown in FIGS. 3A and 3B can include the ability to stop the flow of paste toward the strip edge. Because all trenches are oriented parallel to the busbar, they can provide additional drag force to the conductive paste in a direction that is vertical to the busbar. In other words, the conductive paste can be less likely to flow toward the edge of the busbar, hence the strip edge.

Figure 4A:
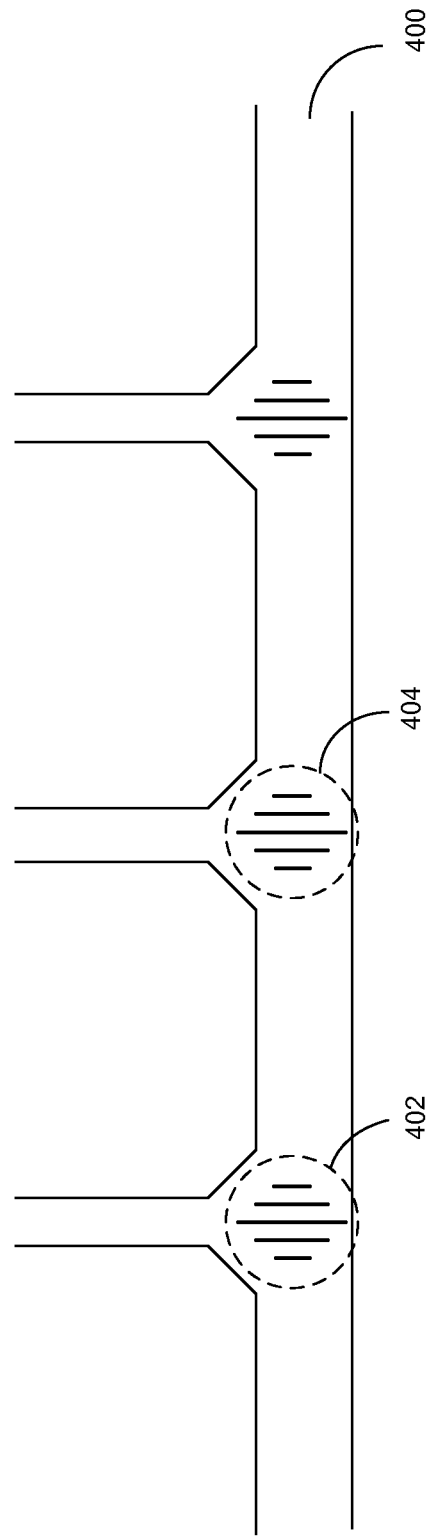
FIG. 4A shows a partial top view of a strip, according to an embodiment of the present invention.
Figure 4B:
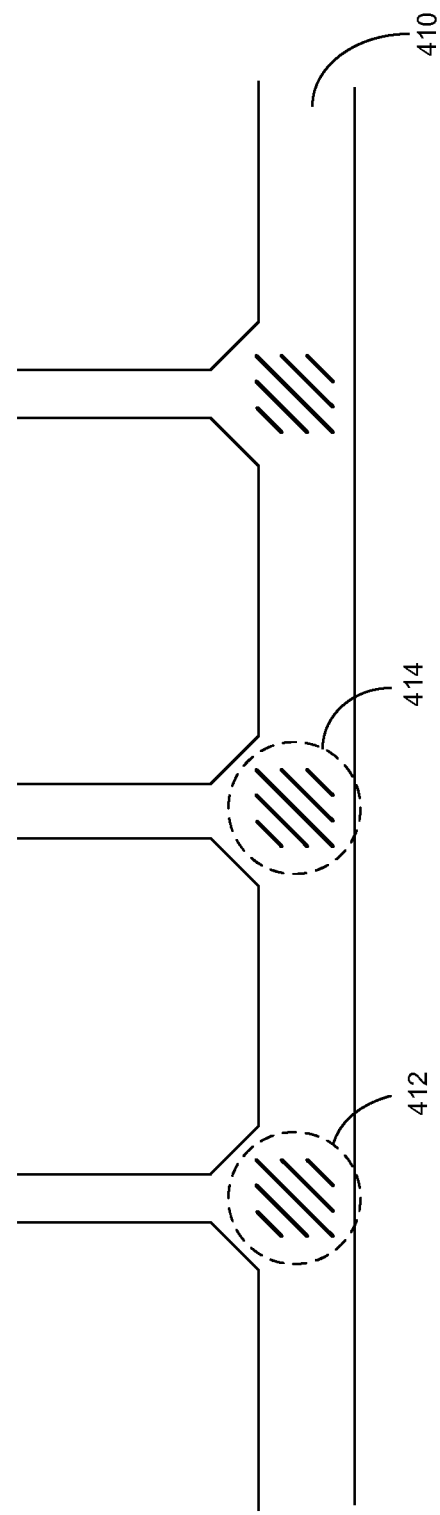
FIG. 4B shows a partial top view of a strip, according to an embodiment of the present invention.

Other trench configurations are also possible. FIG. 4A shows a partial top view of a strip, according to an embodiment of the present invention. In FIG. 4A, edge busbar 400 can include a number of alignment pads, such as alignment pads 402 and 404. Each alignment pad can include a number of parallel trenches that are oriented vertical to busbar 400. The dimensions of the trenches in FIG. 4A can be similar to the trenches shown in FIGS. 3A and 3B. In addition to being parallel or vertical to the busbar, the trenches may also be oriented at an angle with respect to the busbar. FIG. 4B shows a partial top view of a strip, according to an embodiment of the present invention. As shown in FIG. 4B, parallel trenches within alignment pads 412 and 414 can be oriented at a 45° angle with respect to busbar 410. Other orientations of the trenches are also possible. For example, in addition to a 45° angle, the trenches may be oriented at a 135° angle or a 30° angle with respect to the busbar.

Moreover, other than having all trenches parallel to each other, it is also possible to use a number of intersected trenches to form an alignment pad. The advantage of having intersected trenches can be that it can significantly increase the contact area between the busbar and the conductive paste, thus reducing the possibility of paste overflow. FIG. 5A shows a partial top view a strip, according to an embodiment of the present invention. In FIG. 5A, a number of alignment pads, such as alignment pads 502 and 504, can be formed on busbar 500. Each alignment pad can include two sets of parallel trenches, with one set of trenches intersecting the other set of trenches. In the example shown in FIG. 5A, right angles are formed by the intersecting trenches, although in practice, the two sets of trenches may intersect at any arbitrary angles. The dimension of each individual trench in FIG. 5A can be similar to the trenches shown in FIGS. 3A and 3B. The disadvantage of creating alignment pads using intersecting trenches can be that the metal busbar now includes isolated areas of metal. These metal "islands" do not directly contribute to the transport of current, which can lead to the increased resistivity of the busbar. Even after conductive paste fills the trenches to electrically couple these isolated metal "islands" with the rest of the busbar, the busbar can still exhibit increased resistivity, because the resistivity of the conductive paste is often higher than that of Cu.

In addition to straight trenches, one may form the alignment pads using circular trenches. FIG. 5B shows a partial top view of a strip, according to an embodiment of the present invention. In FIG. 5B, a number of alignment pads, such as alignment pads 512 and 514, can be formed on busbar 510. Each alignment pad can include a number of concentric circular trenches. The advantage of the circular trenches can be that the drag force to the conductive paste can be increased in all directions. However, similar to the example shown in FIG. 5A, the alignment can pads in FIG. 5B include isolated metal "islands," which can lead to increased busbar resistivity.

Figure 6A:
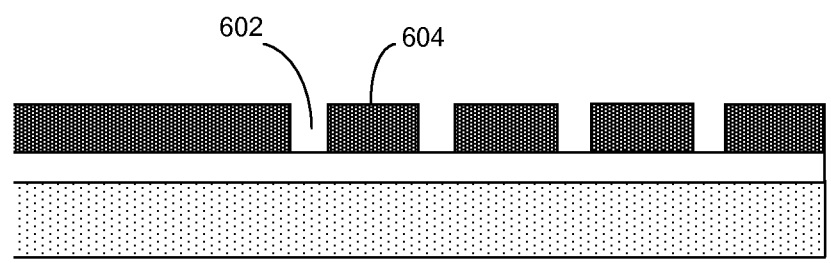
FIG. 6A shows a partial cross-sectional view of the strip, according to an embodiment of the present invention.
Figure 6B:
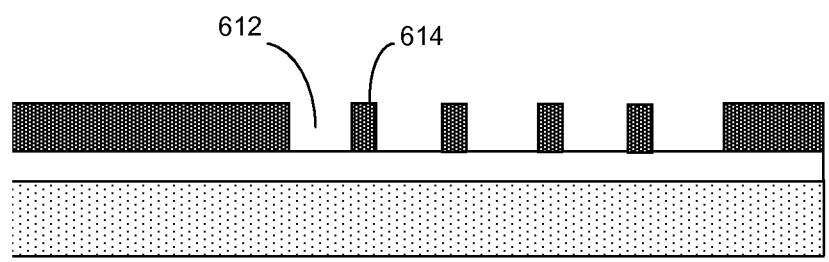
FIG. 6B shows a partial cross-sectional view of the strip, according to an embodiment of the present invention.

In the example shown in FIG. 3B, the trench dimension can be similar to the dimension of the conductive strips separating adjacent trenches. In practice, the trenches and the conductive strips can have different dimensions, as shown in FIGS. 6A and 6B, each of which shows a partial cross-sectional view of the strip. In FIG. 6A, the width of the trenches, such as trench 602, can be much narrower than that of the conductive strips, such as conductive strip 604, separating adjacent trenches. For example, the width of the trenches can be between 30 and 50 microns, whereas the width of the conductive strips can be around 100 to 150 microns. Having wider conductive strips can increase the metal reliability (the metal columns are less likely to collapse) and decrease the impact on the busbar resistivity by the trenches. However, the narrower trenches tend to provide limited overflow-prevention abilities. In FIG. 6B, the width of the trenches, such as trench 612, can be much larger than the width of the conductive strips, such as conductive strip 614. For example, the width of the trenches can be between 100 and 150 microns, while the width of the conductive strips can be between 30 and 50 microns. The wider trenches can provide enhanced overflow-prevention capability. However, the narrower conductive strips can lead to increased busbar resistivity and decreased metal reliability.

Figure 7A:
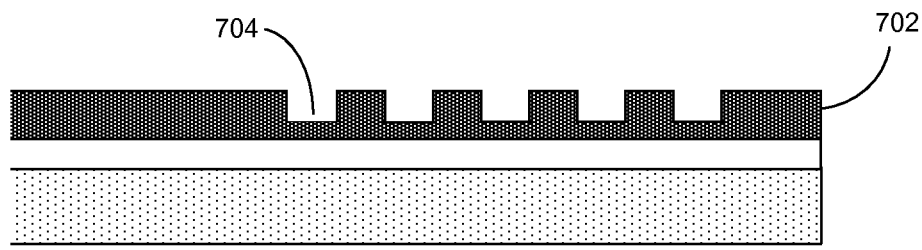
FIG. 7A shows a partial cross-sectional view of the strip, according to an embodiment of the present invention.

It has been assumed so far that the trenches are formed at the same time the metal busbar is formed, using the same mask. As a result, the trenches are areas that are absent of metal within the busbar. In practice, it is also possible to form additional trenches on the busbars without modifying the existing mask. For example, laser or mechanical scribing can be used to create trenches on existing busbars. Such created trenches may or may not go through the busbar metal layer. FIG. 7A shows a partial cross-sectional view of the strip, according to an embodiment of the present invention. In FIG. 7A, busbar 702 can include a number of shallow trenches, such as trench 704. These trenches can be formed by partially removing the metal (or reducing the metal thickness) at certain predefined locations. Because the metal is not completely removed at the trench locations, the busbar resistivity can be much less compared with the case where trenches are metal-less. The disadvantage can be that additional fabrication steps may be needed to form such shallow trenches.

Figure 7B:
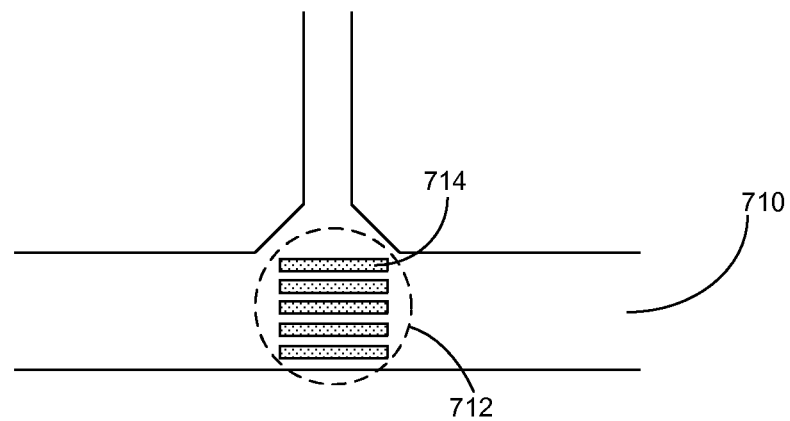
FIG. 7B shows a top view of an alignment pad with parallel shallow trenches, according to an embodiment of the present invention.

FIG. 7B shows a top view of an alignment pad with parallel shallow trenches, according to an embodiment of the present invention. In FIG. 7B, alignment pad 712 can include a number of parallel trenches, such as trench 714, that are oriented in a direction parallel to busbar 710. The bottom of the trenches, indicated by the dotted pattern, can be the same metal forming the busbar. Because the trenches are shallow, the conductive strip between adjacent trenches can be much narrower without the worry of metal collapsing. In some embodiments, the thickness of the conductive strips can be less than 50 microns. In FIG. 7B, all trenches can be aligned in the busbar direction and can be of the same length. In practice, the trenches may have different orientations or lengths.

Figure 7C:
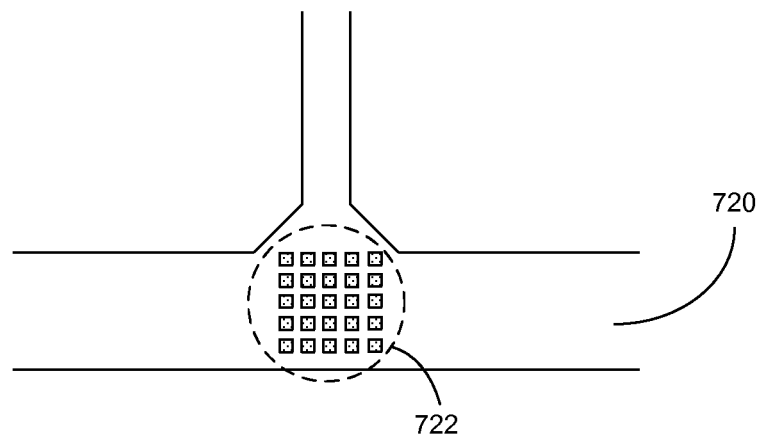
FIG. 7C shows the top view of an alignment pad with a two-dimensional array of indentations, according to an embodiment of the present invention.

In addition to trenches, other types of surface structure can also be formed to prevent paste overflow. In some embodiments, an alignment pad can include a number of indentations arranged into a two-dimensional array. FIG. 7C shows the top view of an alignment pad with a two-dimensional array of indentations, according to an embodiment of the present invention. In FIG. 7C, indentation array 722 can be formed on the surface of busbar 720. Each indentation can be a shallow well, which can have various shapes. In the example shown in FIG. 7C, the indentations are square wells, although other shapes are also possible. The indentations can be formed using similar methods that are used for surface texturing, such as selective etching or mechanical grinding.

Figure 7D:
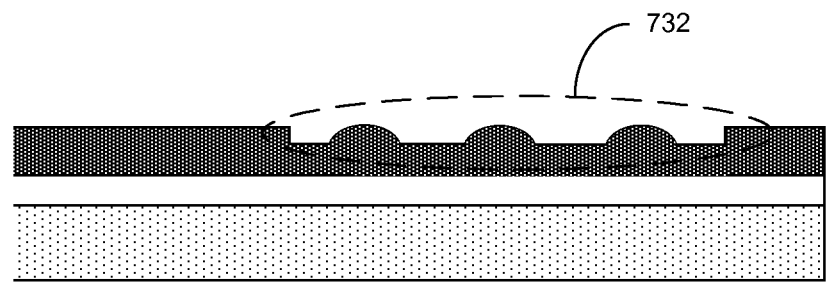
FIG. 7D shows a partial cross-sectional view of a strip, according to an embodiment of the present invention.
Figure 7E:
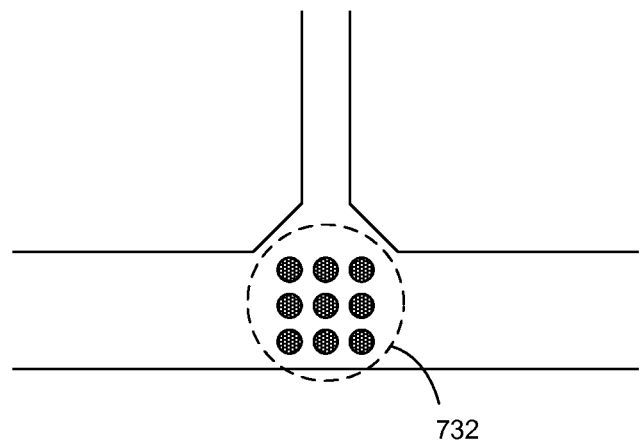
FIG. 7E shows the top view of an alignment pad, according to an embodiment of the present invention.

The trenches shown in FIGS. 3B, 6A-6B, and 7A all have square or rectangular cross sections. In reality, the etching or deposition of the metal layer may result in different profiles, such as undercut or overcut. Other shapes can also be possibly formed. FIG. 7D shows a partial cross-sectional view of a strip, according to an embodiment of the present invention. In FIG. 7D, the bottom of alignment pad 732 can include an array of raised bumps that can be shaped as half spheres. Such a textured bottom can also increase the drag force for paste deposited on alignment pad 732, thus leading to better confinement. FIG. 7E shows the top view of alignment pad 732, according to an embodiment of the present invention. The bottom of the alignment pad may also have other forms of textures, such as triangles or pyramids.

In most automated systems that manufacture solar panels, a conveyor can be used to transport photovoltaic structures between workstations, which can include but are not limited to: scribing, paste application, cleaving, testing, string layup, and annealing. To prevent curing of the conductive paste by the laser beam used for scribing, it can be preferred that the conductive paste be applied after the laser-scribing process. Moreover, it can desirable to perform laser scribing on the side of the base layer opposite to the emitter to prevent possible damages cause by the laser beam to the base-to-emitter junction. If the photovoltaic structure includes a surface-field layer, it can be desirable to apply the laser beam on the side of the surface-field layer. In such scenarios, it is easier to ensure that a groove generated by the laser beam does not penetrate the base layer to reach the base-to-emitter interface. To accommodate the scribing operation, the photovoltaic structures can be placed on the conveyors with the top-facing side being the side of the surface-field layer. Consequently, when conductive paste is applied, it can be applied to busbars located at the surface-field layer side of the photovoltaic structures.

In some embodiments, only the busbars located on the surface-field layer side can include alignment pads, whereas busbars located on the opposite side (the emitter side) can remain unchanged, having a continuous and smooth surface. Forming alignment pads on one side of the photovoltaic structure can be easier than forming them on both sides, especially in scenarios where additional etching may be needed. On the other hand, in scenarios where alignment pads are formed in the same step when the busbars are formed, forming alignment pads on both sides does not require additional fabrication steps. Forming alignment pads on both sides of the photovoltaic structures can increase drag force to the paste when the busbars are stacked against one another, thus further decreasing the possibility of paste overflow.

Busbars with Built-in Channels

Figure 8A:
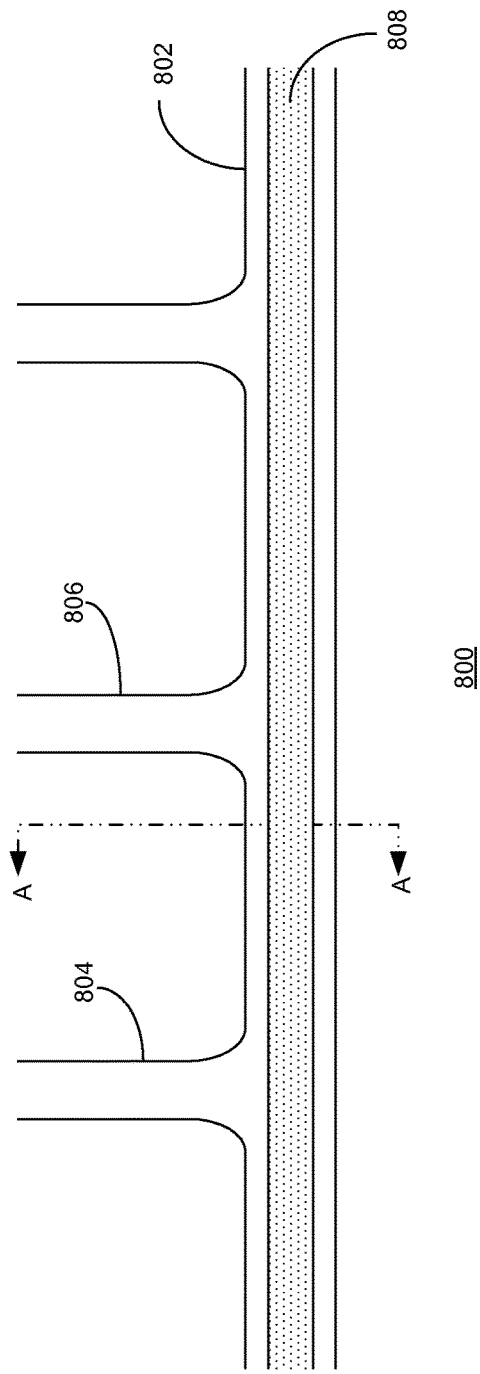
FIG. 8A shows a partial top view of a strip, according to an embodiment of the present invention.

In addition to forming alignment pads on the busbars, other forms of paste-confinement mechanism can also be possible. In some embodiments, a channel that runs the length of the busbar can be formed in order to house the deposited conductive paste. FIG. 8A shows a partial top view of a strip, according to an embodiment of the present invention. In FIG. 8A, strip 800 can include busbar 802 and a plurality of finger lines, such as finger lines 804 and 806. The surface of busbar 802 can include channel 808 (which can be a recess on busbar 802) running along the longitudinal direction of busbar 802. The width of channel 808 can be between ¼ and ¾ of the width of busbar 802. To ensure sufficient busbar electrical conductivity, the depth of channel 808 can be kept to less than half of the thickness of busbar 802. For example, the width of busbar 802 can be between 800 and 1500 microns, and the width of channel 808 can be between 200 and 1200 microns. Similarly, if the thickness of busbar 802 can be between 10 and 50 microns, then the depth of channel 808 can be less than 25 microns.

Figure 8B:
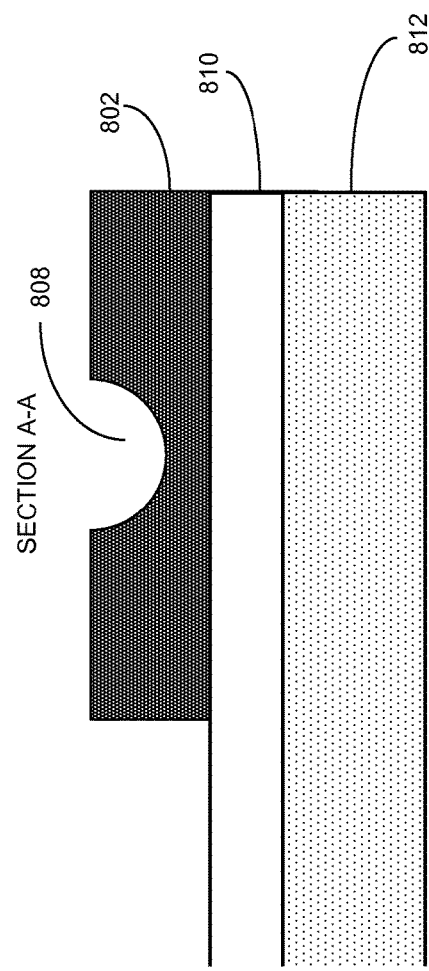
FIG. 8B shows a partial cross-sectional view of a strip, according to an embodiment of the present invention.

FIG. 8B shows a partial cross-sectional view of strip 800, according to an embodiment of the present invention. More specifically, the sectional view of strip 800 shown in FIG. 8B is along cut plane A-A, indicated by dashed arrows shown in FIG. 8A. Plane A-A cuts through the middle of the busbar in a direction that is vertical to the length of the busbar. As shown in FIG. 8B, strip 800 can include a busbar 802, a TCO layer 810, and a photovoltaic body 812. Busbar 802 can include channel 808, and the cross-sectional profile of channel 808 can be a half circle. In some embodiments, such a channel can be formed by partially etching (e.g., using an acid etching process or an electro-etching/deplating process) the surface of the busbar. In addition to the half-circle profile shown in FIG. 8B, channel 808 can have other types of profiles, such as a rectangle, a trapezoid, an ellipse, etc. It is also possible for channel 808 to have straight sidewalls and a curved and sometimes textured bottom. The formation of a channel on the busbar surface can enable the confinement of subsequently deposited conductive paste. Ideally, the conductive paste will remain within the channel and will not flow to the edge of the busbar.

Figure 8C:
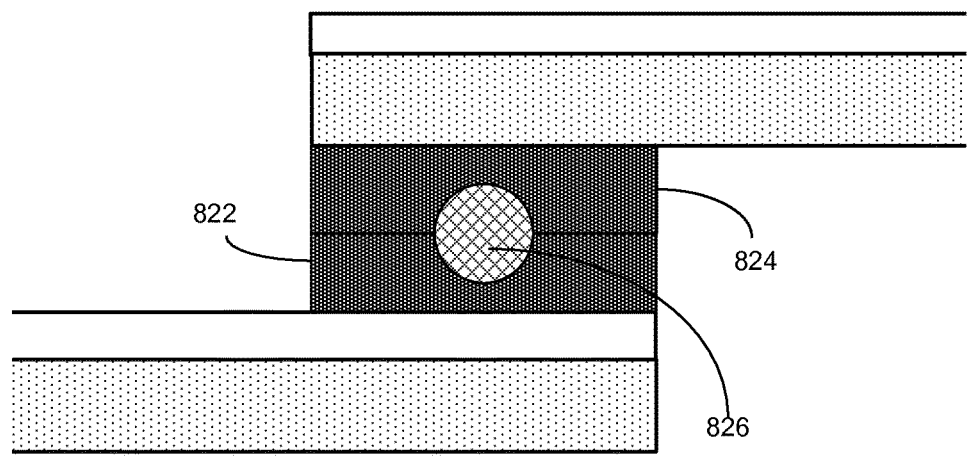
FIG. 8C shows a partial cross-sectional view of two edge-overlapped strips, according to an embodiment of the present invention.

FIG. 8C shows a partial cross-sectional view of two edge-overlapped strips, according to an embodiment of the present invention. In the example shown in FIG. 8C, busbars on both sides of the photovoltaic structures can include recessed channels, and the channel positions can be aligned to each other. When opposite edge busbars of adjacent photovoltaic structures (e.g., edge busbars 822 and 824) are stacked against each other, hollow cylindrical channel 826 can be formed to house the conductive paste. The cross-hatched area shown in FIG. 8C indicates the conductive paste deposited in cylindrical channel 826 formed by the stacked edge busbars. In some embodiments, most of the conductive paste that was deposited onto edge busbar 822 can be contained within channel 826, thus significantly reducing the possibility of paste overflow.

Figure 8D:
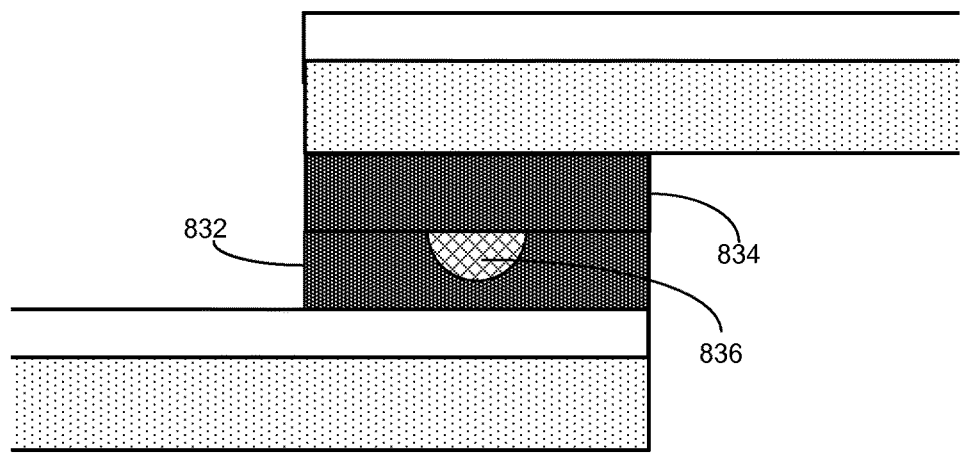
FIG. 8D shows a partial cross-sectional view of two edge-overlapped strips, according to an embodiment of the present invention.

In addition to forming recessed channels on both edge busbars of a photovoltaic structure, in some embodiments, the recessed channel can be formed on only one of the edge busbars. For example, the recessed channel can be formed on the edge busbar located on the surface-field layer side of the photovoltaic structure, given that the conductive paste is typically deposited onto this side. FIG. 8D shows a partial cross-sectional view of two edge-overlapped strips, according to an embodiment of the present invention. In FIG. 8D, edge busbar 832 is located on the surface-field layer side of the left photovoltaic structure, and edge busbar 834 is located on the emitter side of the right photovoltaic structure. The surface of edge busbar 832 can include a recessed channel, whereas edge busbar 834 can remain unchanged, i.e., having a conventional busbar profile. Channel 836, which can be shaped as a half cylinder, can be formed by stacked busbars 832 and 834. The cross-hatched area shown in FIG. 8D indicates the conductive paste contained in channel 836.

Figure 8E:
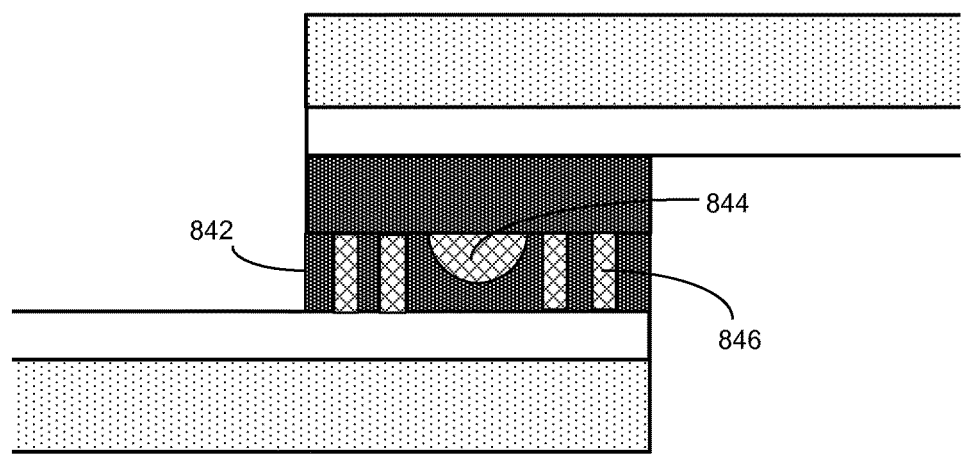
FIG. 8E shows a partial cross-sectional view of two edge-overlapped strips, according to an embodiment of the present invention.

In some embodiments, a recessed channel can be combined with trenches in order to further increase the paste-confinement capability of the busbar. FIG. 8E shows a partial cross-sectional view of two edge-overlapped strips, according to an embodiment of the present invention. In FIG. 8E, in addition to channel 844, additional trenches (e.g., trench 846) can also be formed on busbar 842. These additional trenches not only can provide more confinement to the conductive paste, but also can provide additional bonding between the overlapped edge busbars. In the example shown in FIG. 8E, these additional trenches can include areas that are absent of metal, meaning that these trenches are formed in the same plating process that formed the busbar. Alternatively, these trenches can also be formed by partially removing metal in certain areas, and the trenches may not go through the metal layer completely. Unlike channel 844 that runs the length of busbar 842, the trenches typically can have limited lengths to prevent the formation of segregated conductive strips.

Figure 9A:
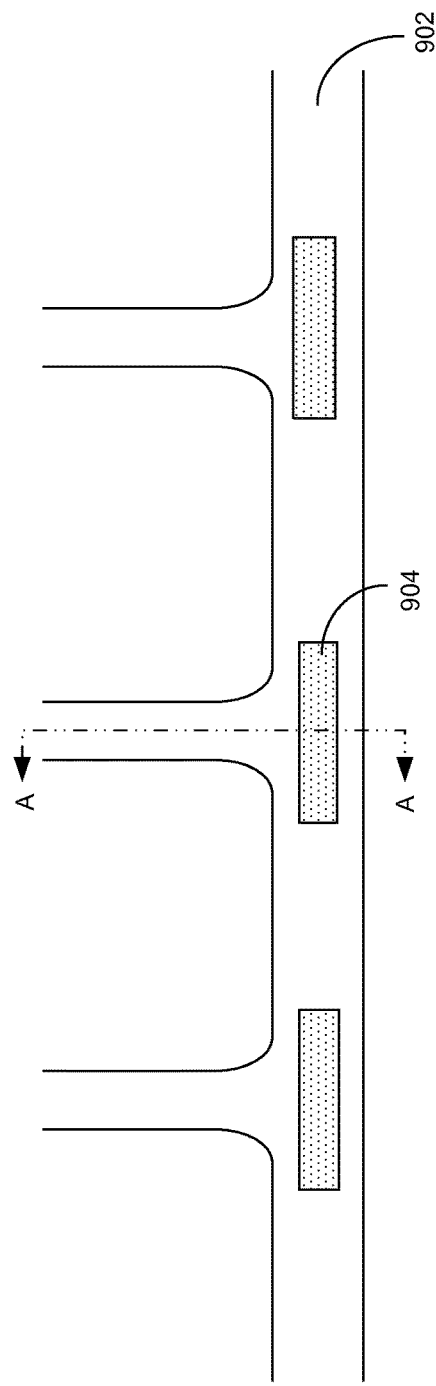
FIG. 9A shows a partial top view of a strip, according to an embodiment of the present invention.

In some embodiments, instead of a channel that runs the entire length of the busbar, a busbar may include multiple shallow grooves along the busbar for housing the conductive paste. FIG. 9A shows a partial top view a strip, according to an embodiment of the present invention. In FIG. 9A, busbar 902 can include a number of grooves, such as groove 904. Each groove can have a width that is smaller than the busbar width and a length that is smaller than the busbar length. In some embodiments, the length of the grooves can be between 300 and 800 microns, and the width of the grooves can be between 300 and 500 microns. To reduce the possibility of paste overflow, the grooves are typically located in the center of busbar 902.

Figure 9B:
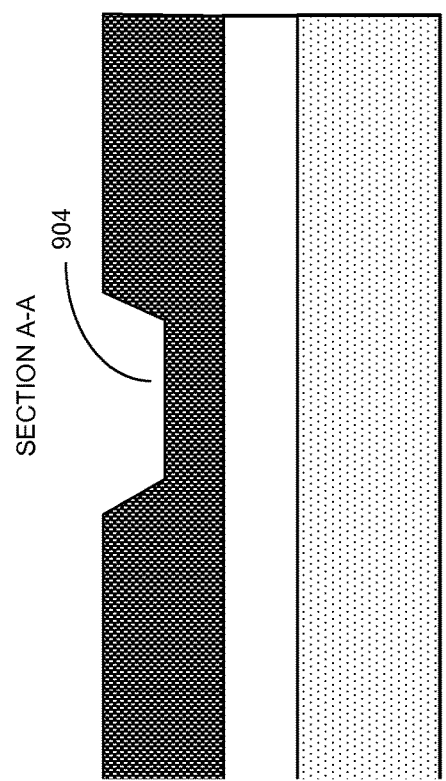
FIG. 9B shows a partial cross-sectional view of a strip, according to an embodiment of the present invention.

FIG. 9B shows a partial cross-sectional view of the strip, according to an embodiment of the present invention. More specifically, FIG. 9B shows the sectional view along cut plane A-A, indicated by dashed arrows shown in FIG. 9A. In the example shown in FIG. 9B, groove 904 can have a trapezoid profile. In practice, other trench profiles, such as rectangle, half circle, triangle, etc., are also possible. In addition, instead of smooth sidewalls and bottom, groove 904 may also have textured sidewalls and bottom. The depth of groove 904 can be between ¼ and ½ of the busbar thickness. Various methods can be used to form the grooves, including but not limited to: laser scribing, acid etching, electro-etching/deplating, etc.

Figure 10A:
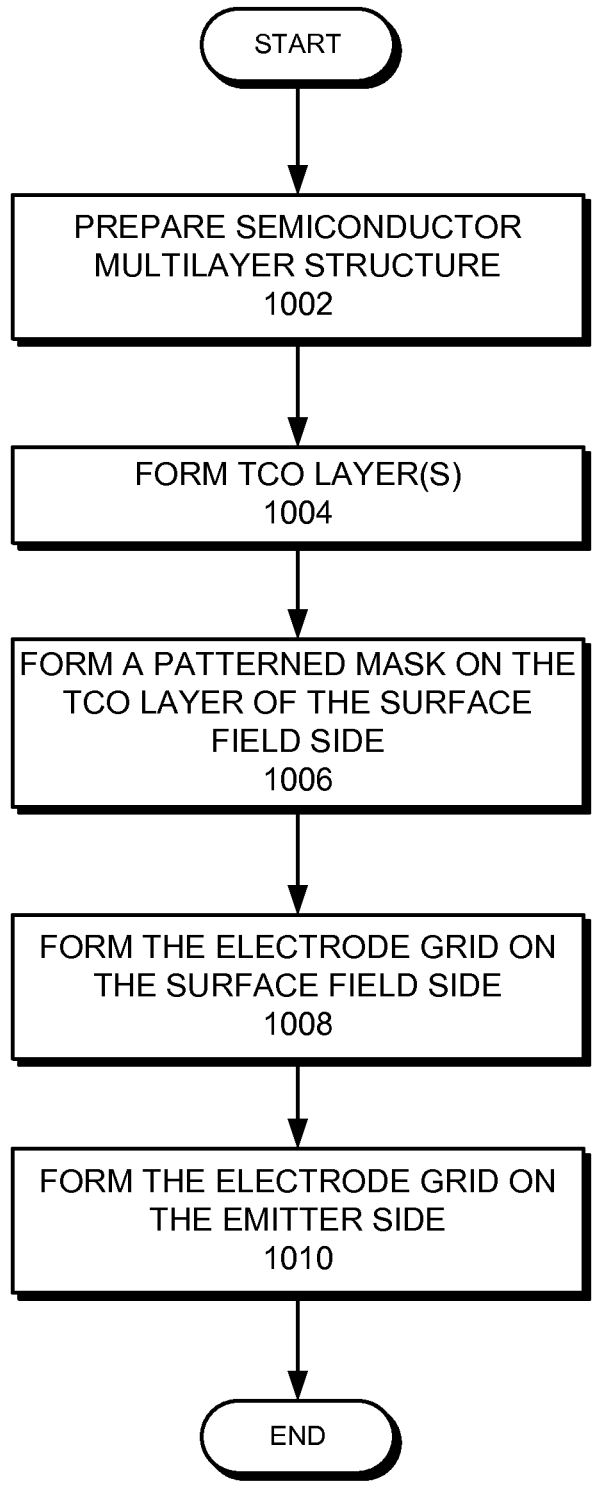
FIG. 10A shows an exemplary process for forming a photovoltaic structure, according to an embodiment of the present invention.

FIG. 10A shows an exemplary process for forming a photovoltaic structure, according to an embodiment of the present invention. During fabrication, a semiconductor multilayer structure can be prepared (operation 1002). The semiconductor multilayer structure can include the base, the emitter, and/or the surface field layer of a photovoltaic structure. The semiconductor multilayer can also optionally include quantum tunneling barrier (QTB) layers on one or both sides of the base layer. A transparent conducting oxide (TCO) layer can then be formed on one or both sides of the semiconductor multilayer structure (operation 1004). Subsequently, a patterned mask layer can be formed on the TCO layer of the surface field side (operation 1006). In some embodiments, the patterned mask layer can include dry film photoresist. The patterned mask can define the electrode grid, including the finger lines and the busbar, and the alignment pads on the busbar. Using the patterned mask, the electrode grid along with the alignment pads can be formed with a single electroplating process (operation 1008). For example, certain areas of the TCO surface, such as the non-grid areas and the trench areas, can be covered by insulating photoresist. As a result, during plating, metallic ions (e.g., Cu ions) will not be deposited onto those areas. The electrode grid on the emitter side can also be formed using a patterned mask (operation 1010). The patterned mask on the emitter side can optionally include windows for the trenches. In some embodiments, the patterned mask on the emitter side merely defines a conventional grid pattern. In the example shown in FIG. 10A, the electrode grids on the two sides of the photovoltaic structure can be formed in separate steps. In practice, it is also possible to form both electrode grids using a single electroplating operation.

Figure 10B:
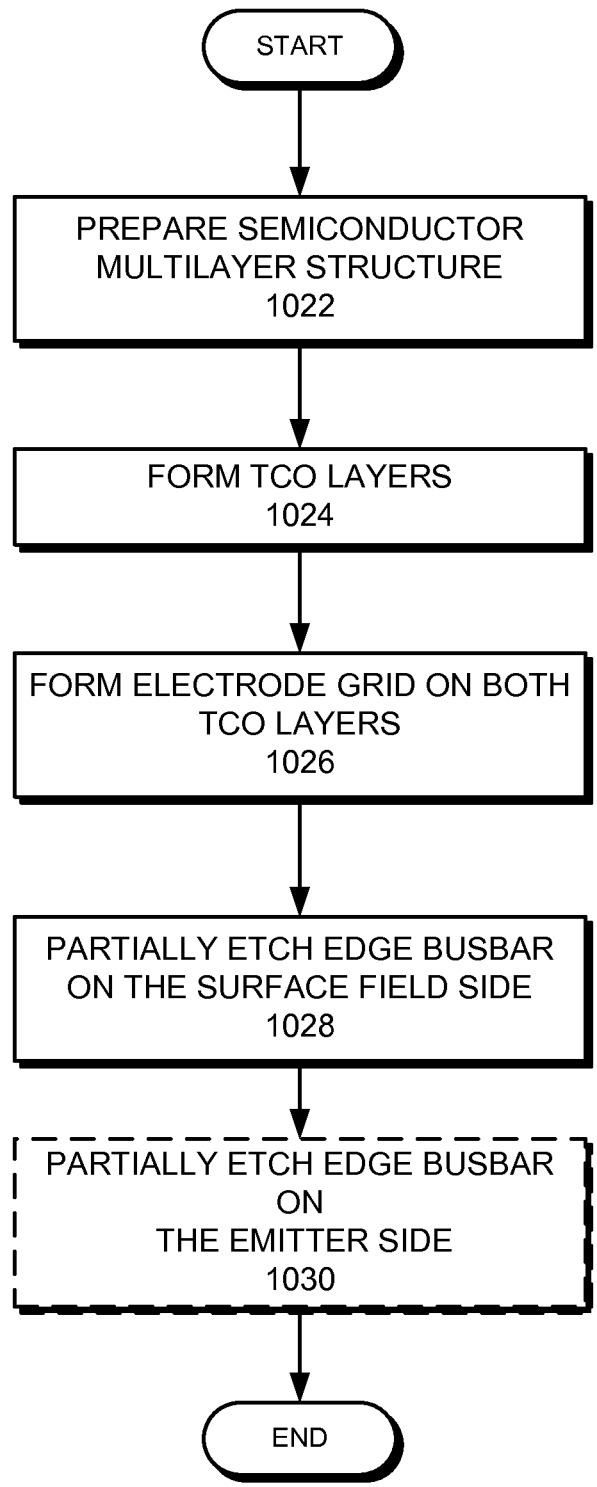
FIG. 10B shows an exemplary process for forming a photovoltaic structure, according to an embodiment of the present invention.

FIG. 10B shows an exemplary process for forming a photovoltaic structure, according to an embodiment of the present invention. During fabrication, a semiconductor multilayer structure can be prepared (operation 1022), and a transparent conducting oxide (TCO) layer can then be formed on both sides of the semiconductor multilayer structure (operation 1024). Subsequently, electrode grids with finger lines and edge busbars can be formed on both TCO layers (operation 1026). In some embodiments, forming the electrode grids can involve an electroplating process. The edge busbars formed here can be conventional edge busbars with a flat and smooth surface. After the formation of the edge busbars, in some embodiments, the edge busbar on the side of the surface-field-layer can be partially etched at certain locations to form paste-alignment structures (operation 1028). The paste-alignment structures can include various types of alignment pads or a channel that runs the length of the edge busbar. The fabrication process can include an optional step that partially etches the edge busbar on the side of the emitter to create paste-alignment structures (operation 1030). Alternatively, the partial etching of the edge busbar can be performed in a single operation.

In general, embodiments of the present invention provide various solutions for confining conductive paste deposited onto a busbar. By adding topographical structures on the otherwise smooth surface of the busbar, one can increase the drag force between the busbar metal and the conductive paste, thus reducing the paste overflow possibility. In addition, recessed spaces (in the form of channels or grooves) can be created on the busbar surface to house the deposited conductive paste. These additional structures can be formed in the same process that forms the busbar, or they can be formed using a separate process. The busbar structures shown in FIGS. 3A-9B are merely exemplary, and other types of structure are also possible, as long as the added topographical structure on the busbar surface does not interfere with the stacking of the edge busbars of adjacent photovoltaic structures.

For example, if the topographical structure includes trenches, the number and dimension of the trenches can be the same or different than the ones shown in FIGS. 3A-6B, and 8E. Similarly, if the topographical structure includes an array of indentations, the number and dimension of indentations can be the same or different than the ones shown in FIGS. 7A-7E. In addition, it is also possible for a busbar to have different types of alignment pad; it is also possible for different busbars of a photovoltaic structure to have different types of alignment pad. For example, the busbar at the bottom of the stack may have alignment pads as shown in FIG. 3A, whereas the busbar at the top of the stack may have alignment pads as shown in FIG. 4A. As a result, the conductive paste sandwiched between the stacked busbars is confined in both the direction along the busbar and the direction perpendicular to the busbar without increasing busbar resistivity.

FIGS. 8A-8E show a single channel along the length of the busbar; in practice, it is also possible to have more parallel channels that can facilitate paste confinement. FIG. 9A shows equally spaced grooves; in practice, it is also possible to have unequally spaced grooves, especially considering that certain locations of the busbar are reserved for probe tests and will not be deposited with conductive paste.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An electrode grid positioned at least on a first surface of a photovoltaic structure, comprising:
   a number of finger lines; and
   an edge busbar positioned at an edge of the photovoltaic structure, wherein the edge busbar includes one or more paste-alignment structures configured to facilitate confinement of conductive paste used for bonding the edge busbar to an opposite edge busbar of an adjacent photovoltaic structure.

2. The electrode grid of claim 1, wherein the paste-alignment structures include one or more alignment pads.

3. The electrode grid of claim 2, wherein a respective alignment pad is located at an intersection between a finger line and the edge busbar.

4. The electrode grid of claim 2, wherein a respective alignment pad includes a plurality of trenches.

5. The electrode grid of claim 4, wherein the trenches include areas that are absent of conductive material that forms the edge busbar, and wherein the trenches are formed in a same fabrication process that forms the edge busbar.

6. The electrode grid of claim 5, wherein forming the trenches involves exposing dry film resist via a patterned mask which defines the edge busbar and locations and sizes of the trenches.

7. The electrode grid of claim 4, wherein the trenches are formed by partially etching the edge busbar at predetermined locations.

8. The electrode grid of claim 4, wherein the trenches are aligned in a direction parallel to the edge busbar.

9. The electrode grid of claim 4, wherein a respective trench has a width between 30 and 200 microns.

10. The electrode grid of claim 1, wherein the paste-alignment structures include a channel running a length of the edge busbar.

11. The electrode grid of claim 1, wherein the edge busbar includes a Cu layer formed using an electroplating process.

12. A photovoltaic structure, comprising:
a semiconductor multilayer structure; and
an electrode grid positioned on a first surface of the photovoltaic structure, wherein the electrode grid comprises:
a number of finger lines; and
an edge busbar positioned at an edge of the first surface, wherein the edge busbar includes a paste-alignment structure configured to facilitate confinement of conductive paste used for bonding the edge busbar to an opposite edge busbar of an adjacent photovoltaic structure.

13. The photovoltaic structure of claim 12, further comprising a second electrode grid positioned on a second surface of the photovoltaic structure, wherein the second electrode grid comprises a second edge busbar positioned at an edge of the second surface, and wherein the second edge busbar includes a second paste-alignment structure.

14. The photovoltaic structure of claim 12, wherein the paste-alignment structure includes an alignment pad.

15. The photovoltaic structure of claim 14, wherein the alignment pad is located at an intersection between a finger line and the edge busbar.

16. The photovoltaic structure of claim 14, wherein the alignment pad includes a plurality of trenches.

17. The photovoltaic structure of claim 16, wherein the trenches include areas that are absent of conductive material that forms the edge busbar, and wherein the trenches are formed in a same fabrication process that forms the edge busbar.

18. The photovoltaic structure of claim 17, wherein forming the trenches involves exposing dry film resist via a patterned mask which defines the edge busbar and locations and sizes of the trenches.

19. The photovoltaic structure of claim 16, wherein the trenches are formed by partially etching the edge busbar at predetermined locations.

20. The photovoltaic structure of claim 16, wherein the trenches are aligned in a direction parallel to the edge busbar.

21. The photovoltaic structure of claim 16, wherein a respective trench has a width between 30 and 200 microns.

22. The photovoltaic structure of claim 12, wherein the paste-alignment structure includes a channel running a length of the edge busbar.

23. The photovoltaic structure of claim 12, wherein the edge busbar includes a Cu layer formed using an electroplating process.

* * * * *